(12) United States Patent
Kimura et al.

(10) Patent No.: US 11,855,579 B2
(45) Date of Patent: Dec. 26, 2023

(54) POWER GENERATION ELEMENT

(71) Applicants: KABUSHIKI KAISHA TOSHIBA, Tokyo (JP); TOSHIBA ENERGY SYSTEMS & SOLUTIONS CORPORATION, Kanagawa (JP)

(72) Inventors: Shigeya Kimura, Yokohama (JP); Hisashi Yoshida, Kawasaki (JP); Hisao Miyazaki, Yokohama (JP); Hiroshi Tomita, Yokohama (JP); Souichi Ueno, Ota (JP); Takeshi Hoshi, Yokohama (JP); Tatsuo Shimizu, Shinagawa (JP)

(73) Assignees: KABUSHIKI KAISHA TOSHIBA, Tokyo (JP); TOSHIBA ENERGY SYSTEMS & SOLUTIONS CORPORATION, Kanagawa (JP)

( * ) Notice: Subject to any disclaimer, the term of this patent is extended or adjusted under 35 U.S.C. 154(b) by 92 days.

(21) Appl. No.: 17/399,478

(22) Filed: Aug. 11, 2021

(65) Prior Publication Data

US 2022/0166369 A1 May 26, 2022

(30) Foreign Application Priority Data

Nov. 20, 2020 (JP) ................................. 2020-193238

(51) Int. Cl.
*H02S 10/30* (2014.01)
*H10N 10/17* (2023.01)
*H10N 10/855* (2023.01)

(52) U.S. Cl.
CPC ............. *H02S 10/30* (2014.12); *H10N 10/17* (2023.02); *H10N 10/855* (2023.02)

(58) Field of Classification Search
CPC ........ H02S 10/30; H01L 31/09; H01L 31/095
See application file for complete search history.

(56) References Cited

U.S. PATENT DOCUMENTS

| 7,211,891 B2 | 5/2007 | Shimogishi et al. |
| 7,327,026 B2 | 2/2008 | Shimogishi et al. |
| (Continued) | | |

FOREIGN PATENT DOCUMENTS

| JP | 07-177772 | 7/1995 |
| JP | 08-237972 | 9/1996 |
| (Continued) | | |

OTHER PUBLICATIONS

Kato, H. et al. "Heavily phosphorus-doped nano-crystalline diamond electrode for thermionic emission application" Diamond & Related Materials 63 (2016), pp. 165-168.

(Continued)

*Primary Examiner* — Daniel P Malley, Jr.
(74) *Attorney, Agent, or Firm* — Oblon, McClelland, Maier & Neustadt, L.L.P.

(57) ABSTRACT

According to one embodiment, a power generation element includes a first conductive region including a first surface, a plurality of second conductive regions, and a plurality of insulating structure regions. The second conductive regions are arranged along the first surface. A gap is provided between the second conductive regions and the first surface. One of the structure regions is provided between one of the second conductive regions and the first surface. An other one of the structure regions is provided between an other one of the second conductive regions and the first surface.

11 Claims, 6 Drawing Sheets

(56) References Cited

U.S. PATENT DOCUMENTS

| | | | |
|---|---|---|---|
| 10,593,505 B1* | 3/2020 | Katsap | H01J 37/065 |
| 2005/0110099 A1* | 5/2005 | Shimogishi | G11B 7/126 |
| | | | 257/378 |
| 2008/0187093 A1* | 8/2008 | Price | H01J 35/26 |
| | | | 378/19 |
| 2011/0139205 A1 | 6/2011 | Kimura et al. | |
| 2018/0323362 A1* | 11/2018 | Schwede | H10N 10/853 |

FOREIGN PATENT DOCUMENTS

| | | |
|---|---|---|
| JP | 2005-150230 A | 6/2005 |
| JP | 2005-158917 A | 6/2005 |
| JP | 2011-124412 A | 6/2011 |
| JP | 2013-229971 A | 11/2013 |

OTHER PUBLICATIONS

Lee, J.H. et al. "Microfabricated Silicon Carbide Thermionic Energy Converter for Solar Electricity Generation", 2012 IEEE 25$^{th}$ International Conference on Micro Electro Mechanical Systems (MEMS), 10.1109/MEMSYS.2012.6170386, pp. 1261-1264.

Lee, J.H. et al. "Optimal emitter-collector gap for thermionic energy converters," Appl. Phys. Lett, 100, 173904 (2012), 5 pages.

Bellucci, A. et al. "Preliminary characterization of ST2G: Solar thermionic-thermoelectric generator for concentrating systems", AIP Conference Proceedings 1667, 020007 (2015), 11 pages.

\* cited by examiner

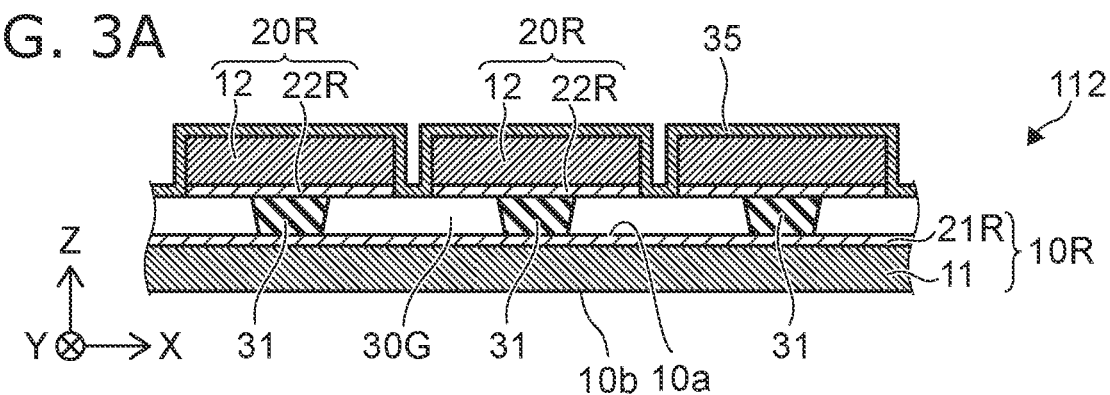
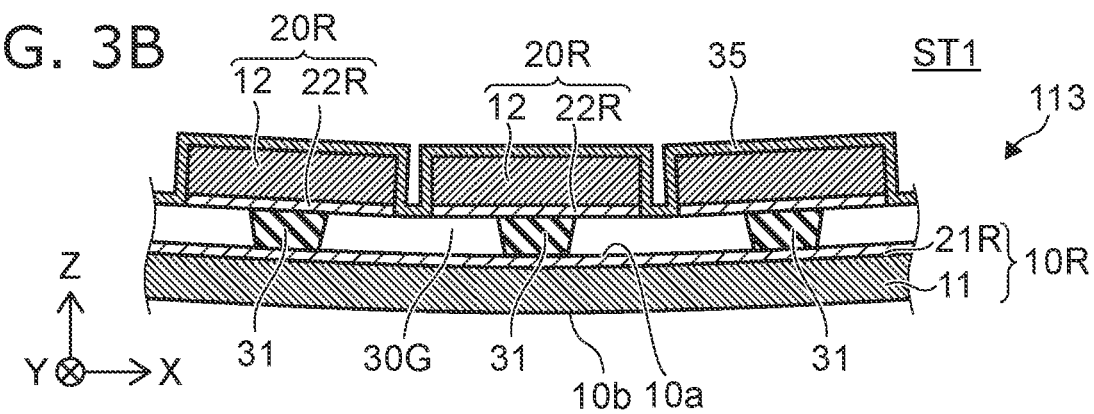
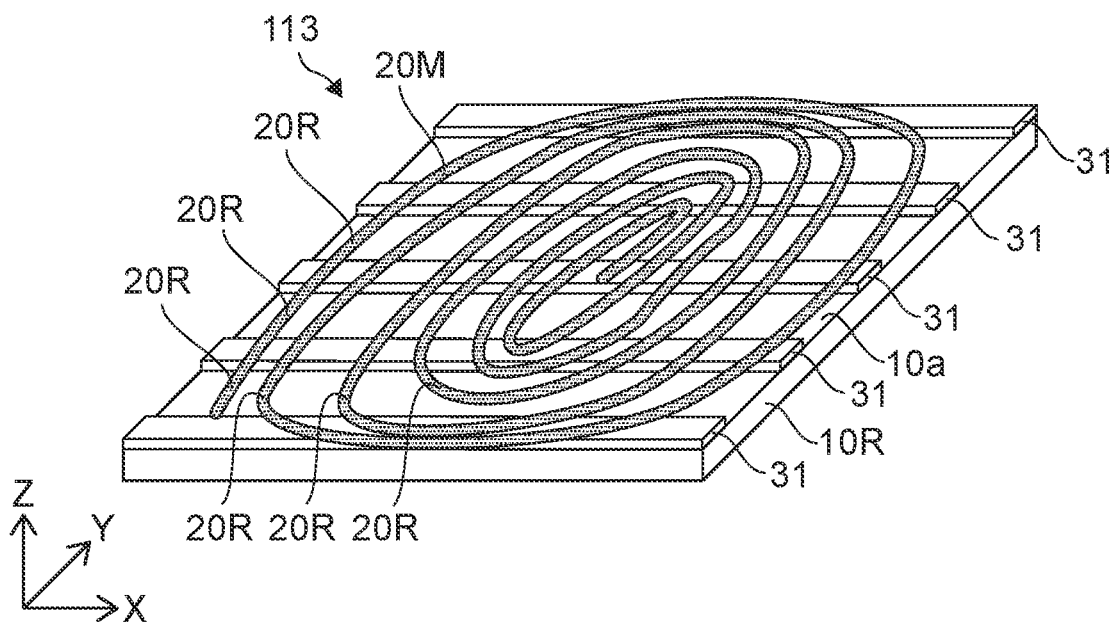
FIG. 4

POWER GENERATION ELEMENT

CROSS-REFERENCE TO RELATED APPLICATIONS

This application is based upon and claims the benefit of priority from Japanese Patent Application No. 2020-193238, filed on Nov. 20, 2020; the entire contents of which are incorporated herein by reference.

FIELD

Embodiments described herein relate generally to a power generation element.

BACKGROUND

For example, there is a power generation element such as a thermionic element. Stable characteristics are desired in the power generation element.

BRIEF DESCRIPTION OF THE DRAWINGS

FIGS. 3A and 3B are schematic cross-sectional views illustrating a power generation element according to the first embodiment;

FIG. 4 is a schematic perspective view illustrating the power generation element according to a first embodiment;

DETAILED DESCRIPTION

Figure 1A:
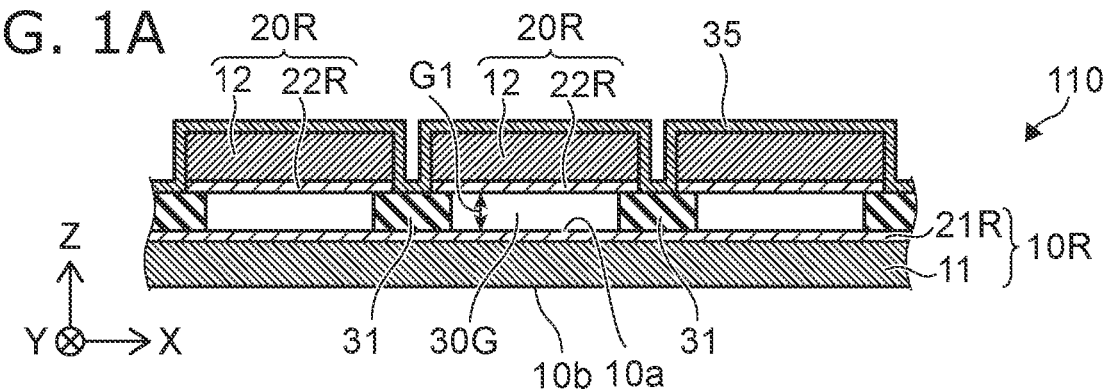
FIGS. 1A to 1C are schematic cross-sectional views illustrating a power generation element according to a first embodiment.

According to one embodiment, a power generation element includes a first conductive region including a first surface, a plurality of second conductive regions, and a plurality of insulating structure regions. The second conductive regions are arranged along the first surface. A gap is provided between the second conductive regions and the first surface. One of the structure regions is provided between one of the second conductive regions and the first surface. An other one of the structure regions is provided between an other one of the second conductive regions and the first surface.

According to one embodiment, a power generation element includes a first conductive layer, a second conductive layer, a first crystal region, a second crystal region, and an insulating structure region. A direction from the first conductive layer toward the second conductive layer is along a first direction. The first crystal region is provided between the first conductive layer and the second conductive layer. The first crystal region includes a plurality of first crystal layers. The first crystal layers are arranged along a second direction crossing the first direction. The second crystal region is provided between the first crystal region and the second conductive layer. The second crystal region includes a plurality of second crystal layers. The second crystal layers are arranged along the second direction. A portion of one of the first crystal layers overlaps a portion of one of the second crystal layers in the first direction. A portion of an other one of the first crystal layers overlaps a portion of an other one of the second crystal layers. A gap is provided between the first crystal region and the second crystal region. The insulating structure region is provided between the first crystal region and the second crystal region.

According to one embodiment, a power generation element includes a first conductive layer, a second conductive layer, a first crystal region, a second crystal region, and a plurality of insulating structure regions. A direction from the first conductive layer toward the second conductive layer is along a first direction. The first crystal region is provided between the first conductive layer and the second conductive layer. The second crystal region is provided between the first crystal region and the second conductive layer. A gap is provided between the first crystal region and the second crystal region. The insulating structure regions are provided between the first crystal region and the second crystal region. The second conductive layer includes a superimposed region overlapping the structure regions in the first direction and a non-superimposed region not overlapping the structure regions in the first direction. A thickness of at least a portion of the superimposed region is thinner than a thickness of the non-super imposed region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
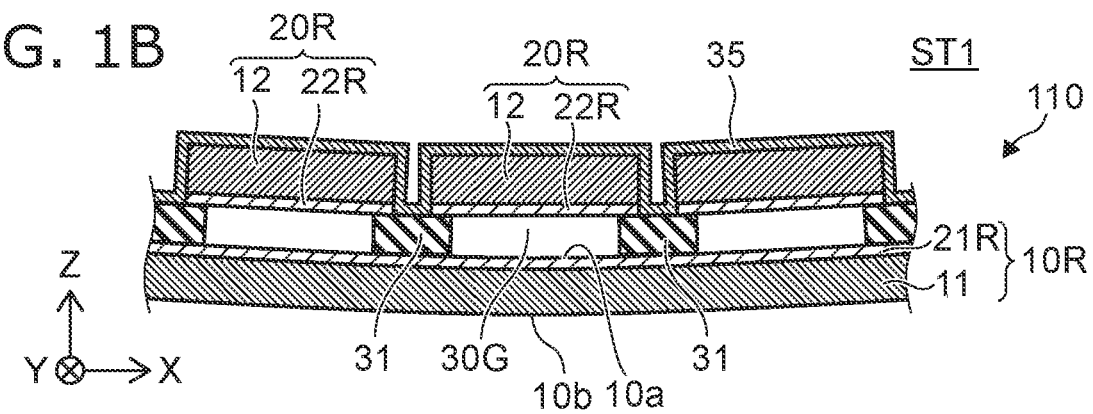
Figure 1C:
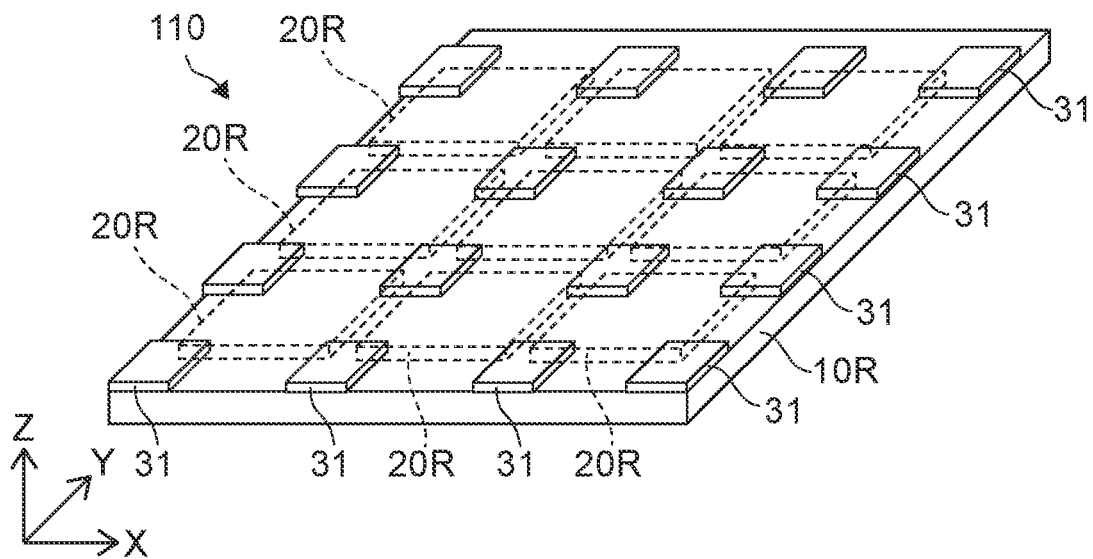

FIGS. 1A to 1C are schematic cross-sectional views illustrating a power generation element according to a first embodiment.

FIG. 1A is a cross-sectional view illustrating one state of the power generation element. FIG. 1B is a cross-sectional view illustrating another state of the power generation element. FIG. 1C is a perspective view.

As shown in FIG. 1A, the power generation element 110 according to the embodiment includes a first conductive region 10R, multiple second conductive regions 20R, and multiple structure regions 31.

The first conductive region 10R includes a first surface 10a. The first surface 10a is, for example, an upper surface.

The multiple second conductive regions 20R are arranged along the first surface 10a. A gap 30G is provided between the multiple second conductive regions 20R and the first surface 10a.

The multiple structure regions 31 are insulating. One of the multiple structure regions 31 is provided between one of the multiple second conductive regions 20R and the first surface 10a. Another one of the multiple structure regions 31 is provided between another one of the multiple second conductive regions 20R and the first surface 10a. The multiple structure regions 31 are, for example, spacers. The multiple structure regions 31 define, for example, a distance between the first conductive region 10R and the multiple second conductive regions 20R (for example, the length of the gap 30G).

The direction perpendicular to the first surface 10a is taken as a Z-axis direction. One direction perpendicular to the Z-axis direction is taken as an X-axis direction. The direction perpendicular to the Z-axis direction and the X-axis direction is taken as a Y-axis direction. The first surface 10a is substantially along the X-Y plane.

For example, when a temperature of the first conductive region 10R is higher than a temperature of the multiple second conductive regions 20R, electrons are emitted from the first conductive region 10R toward the multiple second conductive regions 20R through the gap 30G. The electrons that reach the multiple second conductive regions 20R can be used as electric power. The electrons are, for example, thermions.

In the embodiment, the temperature of the multiple second conductive regions 20R may be set higher than the temperature of the first conductive region 10R. In this case, electrons are emitted from the multiple second conductive regions 20R toward the first conductive region 10R through the gap 30G. The electrons that reach the first conductive region 10R can be used as electric power. The electrons are, for example, thermions. In the example described below, the temperature of the first conductive region 10R is set higher than the temperature of the multiple second conductive regions 20R.

In the embodiment, the multiple second conductive regions 20R are provided. As a result, a distance between each of the multiple second conductive regions 20R and the first conductive region 10R is easy to be uniform.

In a first reference example, one second conductive region 20R having a large area as large as the first conductive region 10R is provided. In the first reference example, at least one of these regions may have distortion. Distortion due to external force or heat may occur in at least one of these regions. In the first reference example, if distortion occurs in the first conductive region 10R or the second conductive region 20R having a large area, it is difficult to make the distance between these regions uniform.

On the other hand, in the embodiment, the multiple second conductive regions 20R having an area smaller than that of the first conductive region 10R are provided. The relative positions of the multiple second conductive regions 20R can be changed independently. For example, even when the first conductive region 10R is distorted, positions of the multiple second conductive regions 20R change with each other, so that the spacing between the first conductive region 10R and each of the multiple second conductive regions 20R can be made uniform. In the embodiment, stable characteristics can be easily obtained.

FIG. 1B illustrates one state (first state ST1) of the power generation element 110. In the first state ST1, the first conductive region 10R is curved. For example, such a state occurs when the temperature of the first conductive region 10R rises and the first conductive region 10R expands.

As shown in FIG. 1B, in the first state ST1, the first surface 10a is concave. Even in such a first state ST1, the positions of the multiple second conductive regions 20R can be changed so as to follow the curvature of the first surface 10a. The distance between each of the multiple second conductive regions 20R and the first conductive region 10R can be made uniform.

As shown in FIG. 1B, the first conductive region 10R may further include the second surface 10b. The first surface 10a is between the second surface 10b and the multiple second conductive regions 20R. The first surface 10a is, for example, an upper surface, and the second surface 10b is a lower surface. As shown in FIG. 1B, in the first state ST1, the second surface 10b is along the first surface 10a. For example, when the first surface 10a is concave, the second surface 10b is convex. Even when the first surface 10a is concave and the second surface 10b is convex, the distance between each of the multiple second conductive regions 20R and the first conductive region 10R can be made uniform. According to the embodiment, a power generation element which is possible to obtain stable characteristics can be provided.

As shown in FIG. 1B, in the first state ST1, one of the multiple second conductive regions 20R and another one of the multiple second conductive regions 20R overlap in a direction (for example, the X-axis direction) along the first surface 10a.

In a second reference example, a spacer is provided in the gap between the multiple second conductive regions 20R. In the second reference example, the spacer and the multiple second conductive regions 20R are separated from each other in order to secure a manufacturing margin. In this case, the area between the spacer and the multiple second conductive regions 20R is useless. Therefore, it is difficult to sufficiently improve efficiency.

On the other hand, in the embodiment, the multiple structure regions 31 are located between the first conductive region 10R and the multiple second conductive regions 20R. Useless areas are suppressed. In the embodiment, high efficiency can be easily obtained.

As shown in FIGS. 1A and 1B, the power generation element 110 may further include a conductive film 35. The multiple second conductive regions 20R are provided between the first conductive region 10R and the conductive film 35. The conductive film 35 electrically connects at least two of the multiple second conductive regions 20R. In this example, at least a portion of the conductive film 35 is between one of the multiple second conductive regions 20R and another of the multiple second conductive regions 20R.

The conductive film 35 includes, for example, at least one selected from the group consisting of Au, Cu, Ag and Pt. A film of such a material is easily deformed. For example, the conductive film 35 can be deformed according to the displacement of the multiple second conductive regions 20R. A stable electrical connection can be obtained. The thickness of the conductive film 35 is not less than 0.1 µm and not more than 10 µm. Appropriate deformability can be obtained.

In FIG. 1C, the conductive film 35 is omitted in order to make the figure easier to see. In this example, the multiple second conductive regions 20R are independent islands. The multiple second conductive regions 20R may be arranged along the X-axis direction and the Y-axis direction, for example.

The multiple second conductive regions 20R may be island-shaped or strip-shaped. The second conductive region 20R may be in a grid pattern. As will be described later, the multiple second conductive regions 20R may be continuous.

Different portions of one continuous spiral second conductive region 20R may be the multiple second conductive regions 20R.

The multiple structure regions 31 may be island-shaped or strip-shaped. The structure region 31 may be in a grid pattern. The multiple structure regions 31 may be continuous. Different parts of one continuous spiral structure region 31 may be the multiple structure regions 31.

As shown in FIGS. 1A and 1B, for example, the first conductive region 10R includes a first conductive layer 11 and a first crystal region 21R. The first crystal region 21R is provided between the first conductive layer 11 and the multiple second conductive regions 20R. For example, one of the multiple second conductive regions 20R includes a second conductive layer 12 and a second crystal region 22R. The second crystal region 22R is provided between the second conductive layer 12 and the first conductive region 10R.

At least one of the first crystal region 21R and the second crystal region 22R includes at least one selected from the group consisting of $Al_{x1}Ga_{1-x1}N$ ($0<x1\leq1$), diamond, and $Ga_2O_3$. In $Al_{x1}Ga_{1-x1}N$, the composition ratio x1 of Al is, for example, not less than 0.3 and not more than 1. For example, at least one of the first crystal region 21R and the second crystal region 22R includes AlGaN. Electrons are emitted efficiently.

For example, at least one of the first conductive layer 11 and the second conductive layer 12 includes at least one of a semiconductor and a metal layer. In one example, the first conductive layer 11 includes a metal and the second conductive layer 12 includes at least one of a semiconductor and a metal layer. For example, the first conductive layer 11 is a metal layer. The second conductive layer 12 is a semiconductor layer such as a silicon layer.

In the embodiment, a length G1 of the gap 30G along the direction (for example, the Z-axis direction) from the first surface 10a toward one of the multiple second conductive regions 20R is not less than 0.5 μm and not more than 50 μm. The length G1 is more preferably not less than 1 μm and not more than 10 μm. It is easy to obtain higher efficiency.

In the following, some examples of the power generation element according to the embodiment will be described.

Figure 2A:
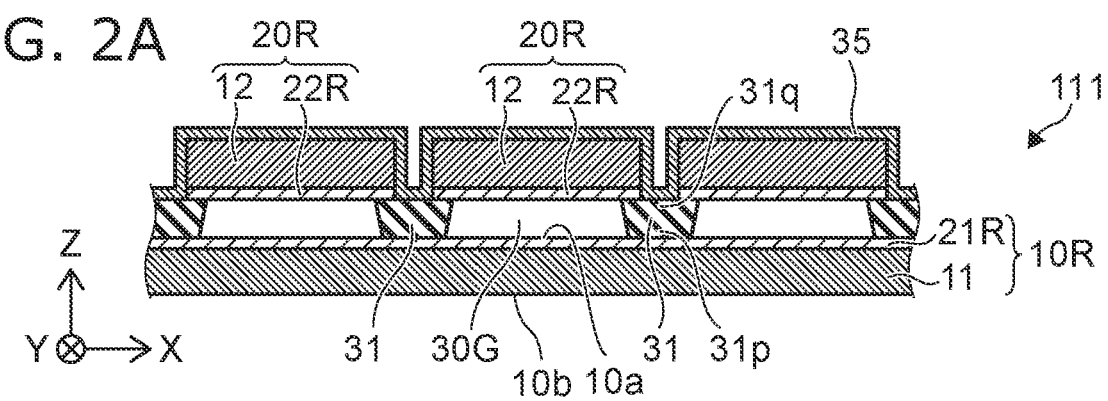
FIGS. 2A and 2B are schematic cross-sectional views illustrating a power generation element according to the first embodiment.
Figure 2B:
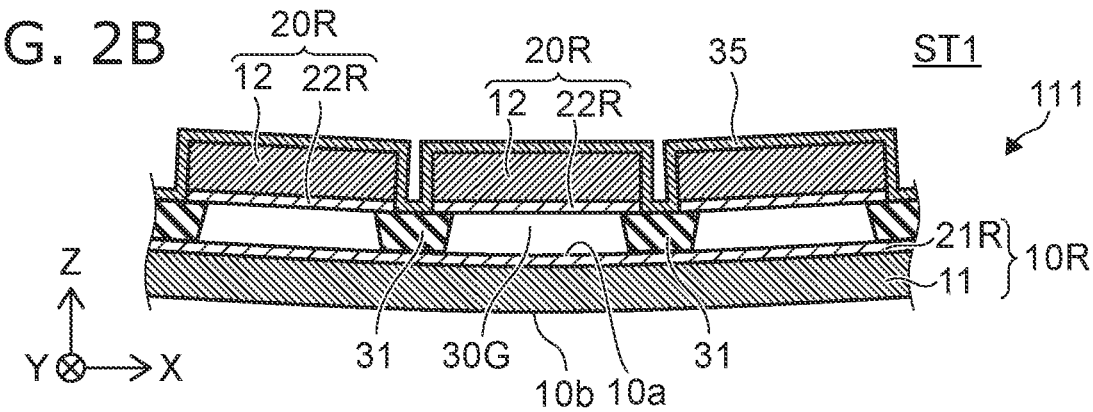

FIGS. 2A and 2B are schematic cross-sectional views illustrating a power generation element according to the first embodiment.

As shown in FIG. 2A, in a power generation element 111 according to the embodiment, a width in the X-axis direction changes along the Z-axis direction in one of the multiple structure regions 31. For example, one of the multiple structure regions 31 includes a first portion 31p and a second portion 31q. The second portion 31q is between the first portion 31p and one of the multiple second conductive regions 20R. A length of the first portion 31p along the X-axis direction is different from a length of the second portion 31q along the X-axis direction. The X-axis direction is one direction along the first surface 10a. In this example, the length of the first portion 31p along the X-axis direction is shorter than the length of the second portion 31q along the X-axis direction. For example, heat conduction through the multiple structure regions 31 is suppressed. It is easy to obtain higher efficiency.

As shown in FIG. 2B, in the first state ST1 of the power generation element 111, the first surface 10a may be concave.

FIGS. 3A and 3B are schematic cross-sectional views illustrating a power generation element according to the first embodiment.

As shown in FIG. 3A, in a power generation element 112 according to the embodiment, the structure region 31 may be provided in each of the multiple second conductive regions 20R. As shown in FIG. 3B, in the first state ST1 of the power generation element 112, the first surface 10a may be concave.

FIG. 4 is a schematic perspective view illustrating the power generation element according to a first embodiment.

As shown in FIG. 4, in a power generation element 113 according to the embodiment, different portions of one spiral conductive member 20M may form the multiple second conductive regions 20R. For example, one of the multiple second conductive regions 20R is one portion of the conductive member 20M, and another one of the multiple second conductive regions 20R may be another portion of the above-mentioned conductive member 20M. In this example, the multiple structure regions 31 are provided. One of the multiple structure regions 31 is provided between one of the multiple second conductive regions 20R and the first surface 10a. Another one of the multiple structure regions 31 is provided between the other one of the multiple second conductive regions 20R and the first surface 10a.

Also in the power generation elements 111 to 113, it is easy to make the distance between the first conductive region 10R and the multiple second conductive regions 20R uniform. A power generation element which is possible to obtain stable characteristics can be provided.

Second Embodiment

Figure 5:
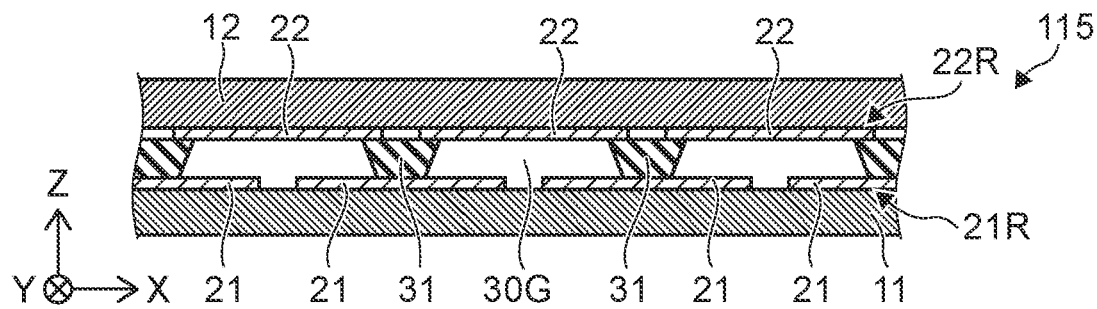
FIG. 5 is a schematic cross-sectional view illustrating a power generation element according to a second embodiment.

FIG. 5 is a schematic cross-sectional view illustrating a power generation element according to a second embodiment.

As shown in FIG. 5, a power generation element 115 according to the embodiment includes the first conductive layer 11, the second conductive layer 12, the first crystal region 21R, the second crystal region 22R, and the structure region 31. A direction from the first conductive layer 11 toward the second conductive layer 12 is along the first direction. The first direction is the Z-axis direction.

The first crystal region 21R is provided between the first conductive layer 11 and the second conductive layer 12. The first crystal region 21R includes multiple first crystal layers 21. The multiple first crystal layers 21 are arranged along a second direction crossing the first direction. The second direction is, for example, the X-axis direction.

The second crystal region 22R is provided between the first crystal region 21R and the second conductive layer 12. The second crystal region 22R includes multiple second crystal layers 22. The multiple second crystal layers 22 are arranged along the second direction (for example, the X-axis direction). A portion of one of the multiple of first crystal layers 21 overlaps a portion of one of the multiple second crystal layers 22 in the first direction (Z-axis direction). A portion of another one of the multiple first crystal layers 21 overlaps a portion of another one of the multiple second crystal layers 22 in the first direction (Z-axis direction).

The gap 30G is provided between the first crystal region 21R and the second crystal region 22R. The structure region 31 is provided between the first crystal region 21R and the second crystal region 22R. The structure region 31 is insulating.

As shown in FIG. 5, for example, one other portion of the multiple first crystal layers 21 overlaps another portion of the multiple second crystal layers 22 in the first direction (Z-axis direction).

In the power generation element 115, it is easy to change positions of the multiple first crystal layers 21 with each other. It is easy to change positions of the multiple second crystal layers 22 with each other. For example, in a case where the temperature of the first conductive layer 11 is different from the temperature of the second conductive layer 12, these conductive layers are deformed by thermal expansion of these conductive layers. For example, either the first conductive layer 11 or the second conductive layer 12 is deformed into a concave shape or a convex shape. Even in such a case, the positions of the multiple first crystal layers 21 or the positions of the multiple second crystal layers 22 are likely to change. As a result, the distance between the first crystal layer 21 and the second crystal layer 22 (the length G1 of the void 30G) tends to be stable and uniform. A power generation element which is possible to obtain stable characteristics can be provided.

In the power generation element 115, for example, the length G1 of the gap 30G (see FIG. 1A) is not less than 0.5 μm and not more than 50 μm. The length G1 is more preferably not less than 1 μm and not more than 10 μm. It is easy to obtain higher efficiency.

In the power generation element 115, when the temperature of the first conductive layer 11 is higher than the temperature of the second conductive layer 12, electrons are emitted from the first crystal region 21R toward the second crystal region 22R through the void 30G. When the temperature of the second conductive layer 12 is higher than the temperature of the first conductive layer 11, electrons are emitted from the second crystal region 22R toward the first crystal region 21R through the void 30G. The electrons are, for example, thermions.

In the power generation element 115, the configurations described with respect to the power generation elements 110 to 113 can be applied to the configurations other than the above.

Third Embodiment

Figure 6A:
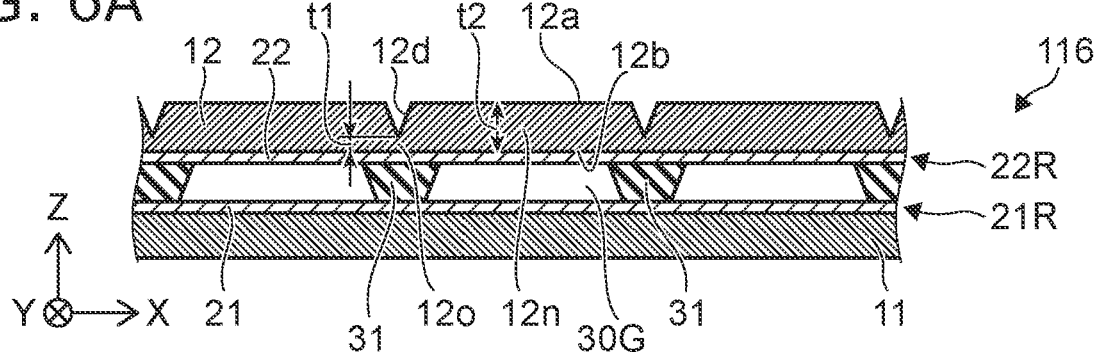
FIGS. 6A and 6B are schematic cross-sectional views illustrating power generation elements according to a third embodiment.
Figure 6B:
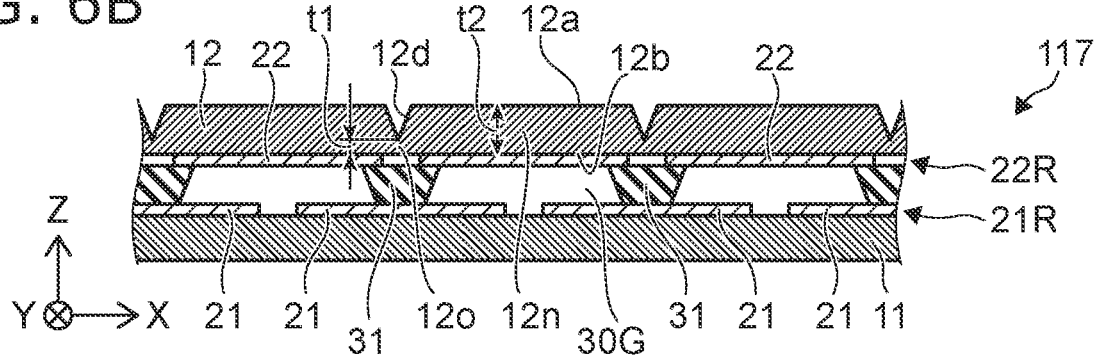

FIGS. 6A and 6B are schematic cross-sectional views illustrating power generation elements according to a third embodiment.

As shown in FIG. 6A, a power generation element 116 according to the embodiment includes the first conductive layer 11, the second conductive layer 12, the first crystal region 21R, the second crystal region 22R, and the structure region 31.

The direction from the first conductive layer 11 toward the second conductive layer 12 is along the first direction (for example, the Z-axis direction). The first crystal region 21R is provided between the first conductive layer 11 and the second conductive layer 12. The second crystal region 22R is provided between the first crystal region 21R and the second conductive layer 12. The gap 30G is provided between the first crystal region 21R and the second crystal region 22R. The structure region 31 is provided between the first crystal region 21R and the second crystal region 22R. The structure region 31 is insulating. Multiple regions of the structure region 31 may become the multiple structure regions 31.

As shown in FIG. 6A, the second conductive layer 12 includes a superimposed region 12o and a non-superimposed region 12n. The superimposed region 12o overlaps the multiple structure regions 31 in the first direction (Z-axis direction). The non-superimposed region 12n does not overlap the multiple structure regions 31 in the first direction. A thickness t1 of at least a portion of the superimposed region 12o is thinner than a thickness t2 of the non-superimposed region 12n.

In the power generation element 116, the second conductive layer 12 is easily bent in the superimposed region 12o. For example, even when the first conductive layer 11 is distorted due to the influence of thermal expansion or the like, the distance between the first crystal region 21R and the second crystal region 22R tends to be stable and uniform. A power generation element which is possible to obtain stable characteristics can be provided.

As shown in FIG. 6A, the second conductive layer 12 includes a first surface 12a and a second surface 12b. The second surface 12b is between the first crystal region 21R and the first surface 12a. The first surface 12a includes a recess 12d provided in the superimposed region 12o. By providing the recess 12d, the second conductive layer 12 is easily deformed.

As shown in FIG. 6B, also in a power generation element 117 according to the embodiment, the thickness t1 of at least a portion of the superimposed region 12o is thinner than the thickness t2 of the non-superimposed region 12n. For example, the first surface 12a includes the recess 12d provided in the superimposed region 12o. In the power generation element 117, the first crystal region 21R includes multiple first crystal layers 21. The multiple first crystal layers 21 are arranged along a direction crossing the Z-axis direction. The second crystal region 22R includes multiple second crystal layers 22. The multiple second crystal layers 22 are arranged along a direction crossing the Z-axis direction.

In the power generation elements 115 and 116, for example, when the temperature of the first conductive layer 11 is higher than the temperature of the second conductive layer 12, electrons are emitted from the first crystal region 21R toward the second crystal region 22R through the void 30G. For example, when the temperature of the second conductive layer 12 is higher than the temperature of the first conductive layer 11, electrons are emitted from the second crystal region 22R toward the first crystal region 21R through the void 30G.

In the power generation elements 116 and 117, the configurations described for the power generation elements 110 to 113 can be applied to the configurations other than the above.

In the first to third embodiments, the multiple structure regions 31 include, for example, at least one selected from the group consisting of Si, Al, Hf and Zr, and at least one selected from the group consisting of oxygen and nitrogen. The multiple structure regions 31 may include, for example, silicon oxide or the like.

Figure 7:
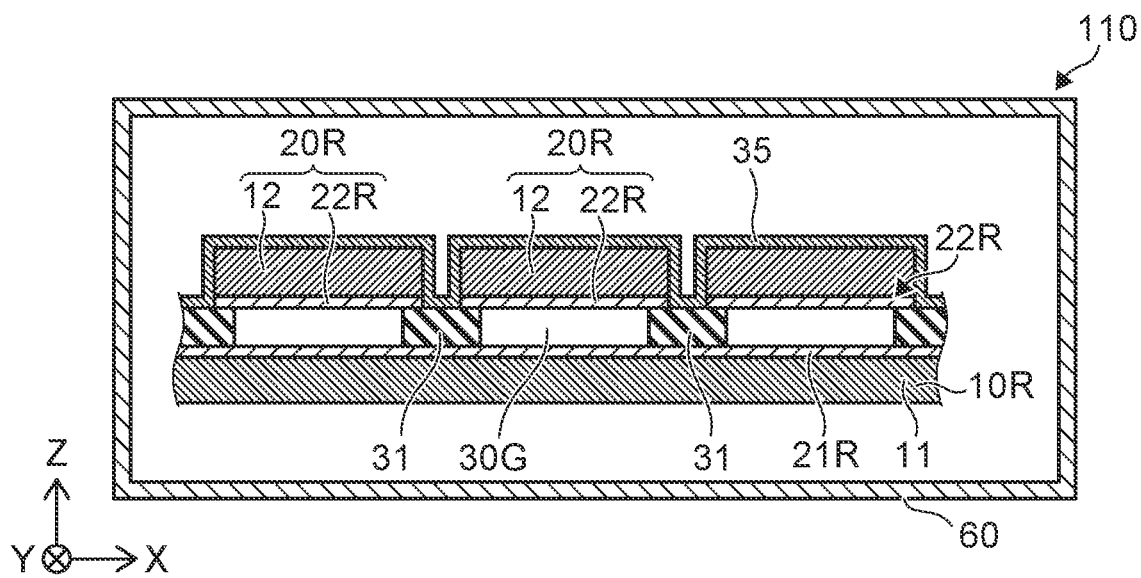
FIG. 7 is a schematic cross-sectional view illustrating the power generation element according to the embodiment.

FIG. 7 is a schematic cross-sectional view illustrating the power generation element according to the embodiment.

As shown in FIG. 7, the power generation element 110 may include a container 60. The first conductive layer 11, the second conductive layer 12, the first crystal region 21R, the second crystal region 22R, and the structure region 31 are provided in the container 60. The pressure inside the container 60 is lower than the atmospheric pressure. For example, the void 30G is in a reduced pressure state. The electrons emitted from one crystal region efficiently reach the other crystal region.

In the following, an example of application of the power generation element will be described.

Figure 8A:
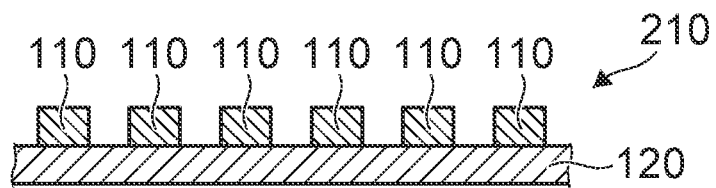
FIGS. 8A and 8B are schematic cross-sectional views illustrating a power generation module and a power generation device according to the embodiment.
Figure 8B:
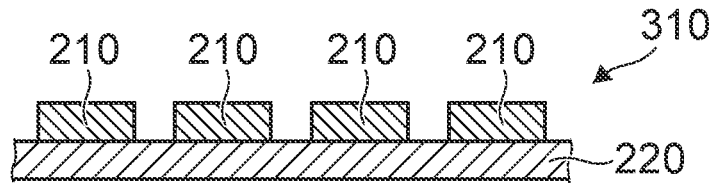

FIGS. 8A and 8B are schematic cross-sectional views illustrating a power generation module and a power generation device according to the embodiment.

As shown in FIG. 8A, a power generation module 210 according to the embodiment includes the power generation element (for example, the power generation element 110) according to the embodiment. In this example, multiple power generation elements 110 are arranged on a substrate 120.

As shown in FIG. 8B, a power generation device 310 according to the embodiment includes the power generation module 210 described above. Multiple power generation modules 210 may be provided. In this example, the multiple power generation modules 210 are arranged on a substrate 220.

Figure 9A:
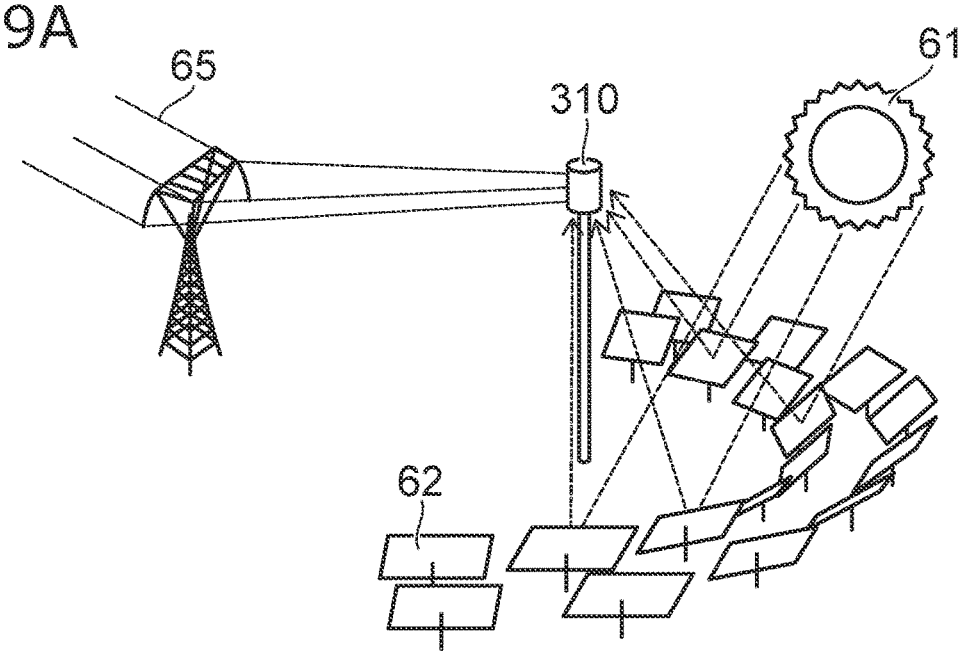
FIGS. 9A and 9B are schematic views illustrating the power generation device and a power generation system according to the embodiment.
Figure 9B:
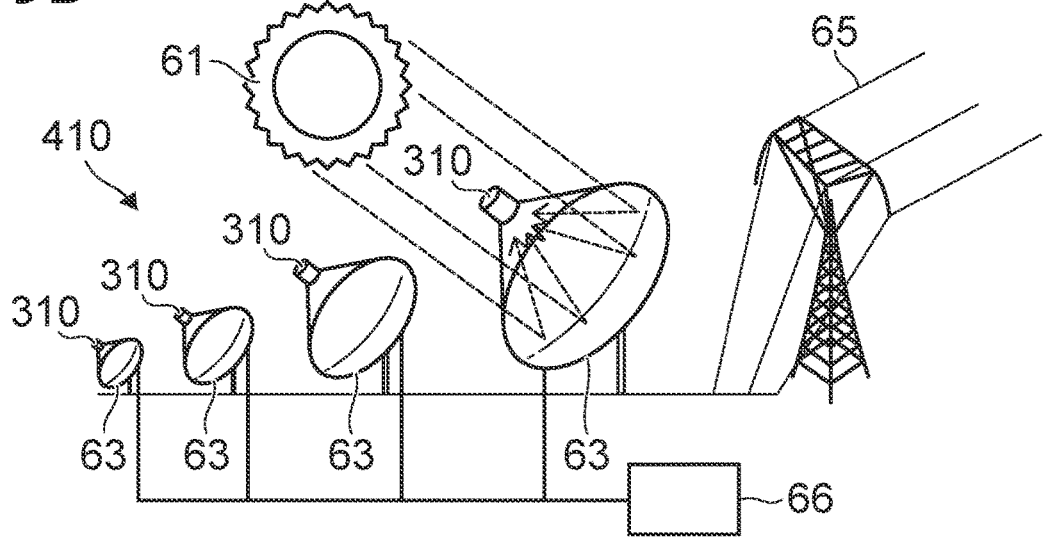

FIGS. 9A and 9B are schematic views showing the power generation device and a power generation system according to the embodiment.

As shown in FIGS. 9A and 9B, the power generation device 310 according to the embodiment (that is, the power generation element 110 according to the embodiment) can be applied to solar thermal power generation.

As shown in FIG. 9A, for example, the light from the sun 61 is reflected by a heliostat 62 and incident on the power generation device 310 (power generation element 110 or power generation module 210). The light raises the temperature of the power generation element. Heat is converted into a current. The current is transmitted by the electric line 65 or the like.

As shown in FIG. 9B, for example, the light from the sun 61 is collected by a condensing mirror 63 and incident on the power generation device 310 (power generation element 110 or power generation module 210). The heat from the light is converted into a current. The current is transmitted by the electric line 65 or the like.

For example, a power generation system 410 includes the power generation device 310. In this example, multiple power generation devices 310 are provided. In this example, the power generation system 410 includes power generation devices 310 and a drive device 66. The drive device 66 causes the power generation device 310 to track the movement of the sun 61. Efficient power generation can be carried out by tracking.

By using the power generation element according to the embodiment (for example, the power generation element 110), high-efficiency power generation can be performed.

According to the embodiment, a power generation element and a power generation system which are possible to improve efficiency can be provided.

In the specification, "a state of electrically connected" includes a state in which multiple conductors physically contact and current flows between the multiple conductors. "A state of electrically connected" includes a state in which another conductor is inserted between the multiple conductors and current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in power generation elements such as conductive layers, crystal regions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all power generation elements practicable by an appropriate design modification by one skilled in the art based on the power generation elements described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power generation element, comprising:
a first conductive region including a first surface;
a plurality of second conductive regions, the second conductive regions being arranged along the first surface, a first gap being provided between the second conductive regions and the first surface the second conductive regions including a first region and a second region, the first region including a first side face, the second region including a second side face, the first side face and the second side faces crossing a plane parallel to the first surface;
a plurality of structure regions being insulating, the structure regions including a first structure region, a second structure region and a third structure region, the first structure region being provided between a part of the first region and the first surface the second structure region being provided between a part of the second region and the first surface; and
a conductive film, the conductive film including a first film region, a second film region, and a third film region, the first film region being fixed to the first side face, the second film region being fixed to the second side face, the third structure region being located between the first surface and the third film region, a second gap being provided between the first film region and the second film region; wherein in a case where a temperature of the first conductive region is higher than a temperature of the second conductive regions, electrons are emitted from the first conductive region toward the second conductive regions through the first gap.

2. The element according to claim 1, wherein
the first surface is concave in a first state.

3. The element according to claim 2, wherein
the first conductive region further includes a second surface,
the first surface is between the second surface and the second conductive regions, and
in the first state, the second surface is convex along the first surface.

4. The element according to claim 2, wherein
in the first state, the first region and the second region overlap in a direction along the first surface.

5. The element according to claim 1, wherein
the conductive film electrically connects the first region with the second region.

6. The element according to claim 5, wherein
the conductive film includes at least one selected from the group consisting of Au, Cu, Ag and Pt.

7. The element according to claim 1, wherein
the first conductive region includes
- a first conductive layer, and
- a first crystal region provided between the first conductive layer and the second conductive regions, and the one of the second conductive regions includes
- a second conductive layer, and
- a second crystal region provided between the second conductive layer and the first conductive region.

8. The element according to claim 7, wherein
at least one of the first crystal region or the second crystal region includes at least one selected from the group consisting of $Al_{x1}Ga_{1-x1}N$ ($0<x1\leq1$), diamond or $Ga_2O_3$.

9. The element according to claim 7, wherein
the first conductive layer includes a metal, and
the second conductive layer includes a semiconductor.

10. The element according to claim 1, wherein
a length of the first gap along a direction from the first surface toward the first region is not less than 0.5 μm and not more than 50 μm.

11. The element according to claim 1, wherein
the conductive film further includes a fourth film region and a fifth film region, the first region is provided between the first surface and the fourth film region in a first direction crossing the first surface, and the second region is provided between the first surface and the fifth film region in the first direction.

* * * * *